United States Patent [19]
Kelsey et al.

[11] Patent Number: 5,243,274
[45] Date of Patent: Sep. 7, 1993

[54] ASIC TESTER

[75] Inventors: Randy J. Kelsey, Hampstead, Md.; Larry D. Aschliman, Jacobus, Pa.

[73] Assignee: Westinghouse Electric Corp., Pittsburgh, Pa.

[21] Appl. No.: 925,684

[22] Filed: Aug. 7, 1992

[51] Int. Cl.$^5$ ............................................. G01R 31/28
[52] U.S. Cl. ................................ 324/158 R; 371/22.1; 371/25.1
[58] Field of Search .................... 324/73.1, 158 R; 371/22.1, 25.1, 27; 107/465

[56] References Cited

U.S. PATENT DOCUMENTS

| | | | |
|---|---|---|---|
| 4,500,993 | 2/1985 | Jacobson | 371/27 |
| 4,503,387 | 3/1985 | Rutledge et al. | 371/22.2 |
| 4,507,576 | 3/1985 | McCracken et al. | 371/27 |
| 4,527,115 | 7/1985 | Mehrotra et al. | 324/73.1 |
| 4,656,632 | 4/1987 | Jackson | 371/25.1 |
| 4,782,283 | 11/1988 | Zasio | 377/70 |
| 4,878,179 | 10/1989 | Larsen et al. | 364/490 |
| 5,017,813 | 5/1991 | Galbraith et al. | 307/465 |
| 5,042,004 | 8/1991 | Agrawal et al. | 307/465 |
| 5,049,814 | 9/1991 | Walker, III et al. | 324/158 |
| 5,111,459 | 5/1992 | De Vigne | 371/27 |
| 5,127,011 | 6/1992 | Combs | 371/27 |
| 5,134,617 | 7/1992 | McRoy | 324/158 R |

Primary Examiner—Ernest F. Karlsen
Attorney, Agent, or Firm—Norman A. Nixon

[57] ABSTRACT

A low cost application specific integrated circuit tester is provided. The tester contains a microprocessor and a test vector RAM bank that is equal in BIT width as the input output pin count of a device under test. The RAM bank holds all vector information for the pins of the device under test. The tester board contains a number of tester ASICs placed between the test vector RAM bank and the devices under test. The tester ASICs are configurable to control the direction of data lines and to compare the results from the device under test to the preloaded RAM data. The present ASIC tester also provides a comparison of the results from two devices under test.

12 Claims, 3 Drawing Sheets

ASIC TESTER

BACKGROUND OF THE INVENTION

1. Field Of The Invention

This invention relates to an apparatus and method for testing electronic circuits and, more specifically, to an apparatus and method for testing application specific integrated circuits.

2. Description Of Related Art

An application specific integrated circuit (ASIC) requires the same number of test vectors to verify correct operation as an entire circuit board comprised of smaller scale integrated circuits. However, unlike a circuit board, no probing is possible within an ASIC. This becomes a problem because it is a great advantage to a circuit board designer to verify the operation of an ASIC prior to its insertion in a board.

Integrated circuits are typically subjected to functional testing in which input signals are provided to all of the input terminals of the integrated circuit. In such functional testing, the output signals on the output terminals are observed in order to verify the proper functioning of the integrated circuit. Such functional testing is generally done utilizing complicated and complex test devices which are very expensive. Some of the test devices even require specific environmental controls be placed on the ASIC.

At present, testers are available specifically for testing ASICs. Such testers require special adapters and are oftentimes package specific. Moreover, such testers rely on complex circuitry and are thus expensive. Many small companies cannot afford such expensive testers. In many cases, these testers offer extra tests which are not required for the specific ASIC which is being tested. Consequently, there is a need for a low cost ASCI tester which is affordable to small companies.

SUMMARY OF THE INVENTION

A low cost ASIC tester is provided which is based itself on ASIC technology. The ASIC tester is a single board into which a device under test (DUT), such as an ASIC, is inserted. The tester includes a microprocessor and a test vector RAM bank that is equal in bit width as the input/output pin count of the DUT. The RAM bank holds all vector information for the DUT input/output pins. In addition, the tester board contains a number of tester ASICs placed between the test vector RAM and the DUT. These tester ASICs are configurable with respect to the particular DUT to control the direction of the data lines and to compare the results of the DUT with preloaded RAM data. In addition to testing a single DUT, the ASIC tester is able to compare the results from two different DUTs. This is useful in a reverse engineering application where a comparison between a developed product and its model is necessary.

DETAILED DESCRIPTION OF THE PREFERRED EMBODIMENTS

Figure 1:
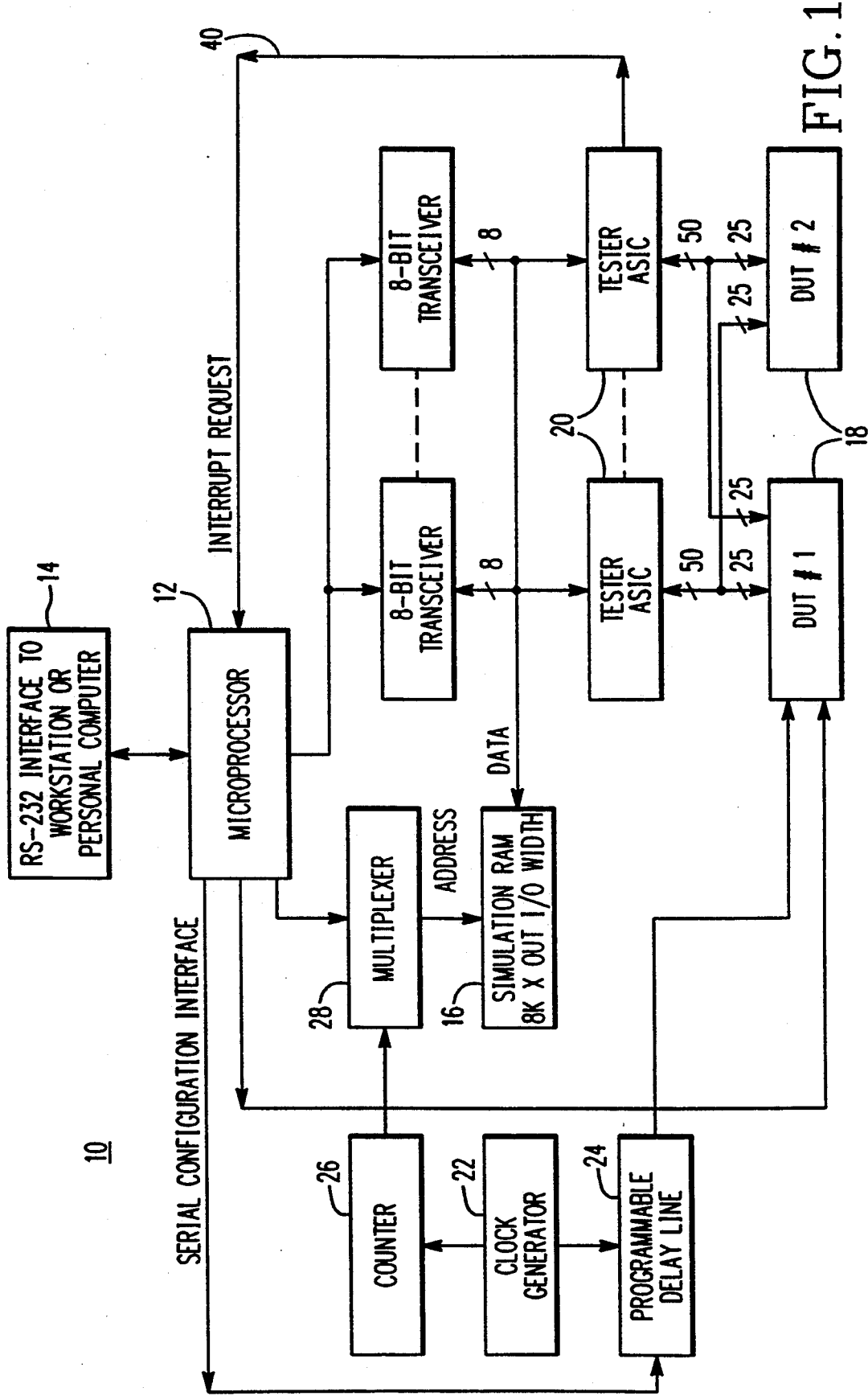
FIG. 1 is a system block diagram of a presently preferred embodiment of the present invention.

As shown in FIG. 1, ASIC test device 10 contains a microprocessor 12 which interfaces with a work station or personal computer 14. Although any microprocessor which possesses serial and parallel ports can be used in test device 10, the 68HC811 microprocessor is presently preferred because of its mix of serial and parallel ports, on-chip read only memory (ROM) and random access memory (RAM). Communication between host workstation 14 and microprocessor 12 is accomplished through the RS-232 interface.

Test device 10 also includes a test vector RAM bank 16. Test vector RAM bank 16 is equal in bit width to the input/output pin count of DUT 18. Test vector RAM bank 16 holds all vector information for the pins on DUT 18. Test device 10 also contains a number of tester ASICs 20 placed between test vector RAM bank 16 and DUT 18. Each tester ASIC 20 is configured with respect to the particular DUT 18 which it interfaces to control the direction of data lines and compare the results of DUT 18 to preloaded RAM data. Test device 10 can also compare the results from two DUTs 18 by using two tester ASICs 20.

For synchronous designs, and for loading results into registers, a clock 22 is provided in tester device 10. Clock 22 is fed into programmable delay line 24 so that the setup time for each DUT 18 may be altered. The on-chip clock 22 is used to load the RAM address that generates the vector data. This is accomplished by means of a counter 26 connected to clock 22 and a multiplexer 28 connected to counter 26 and microprocessor 12.

Figure 2:
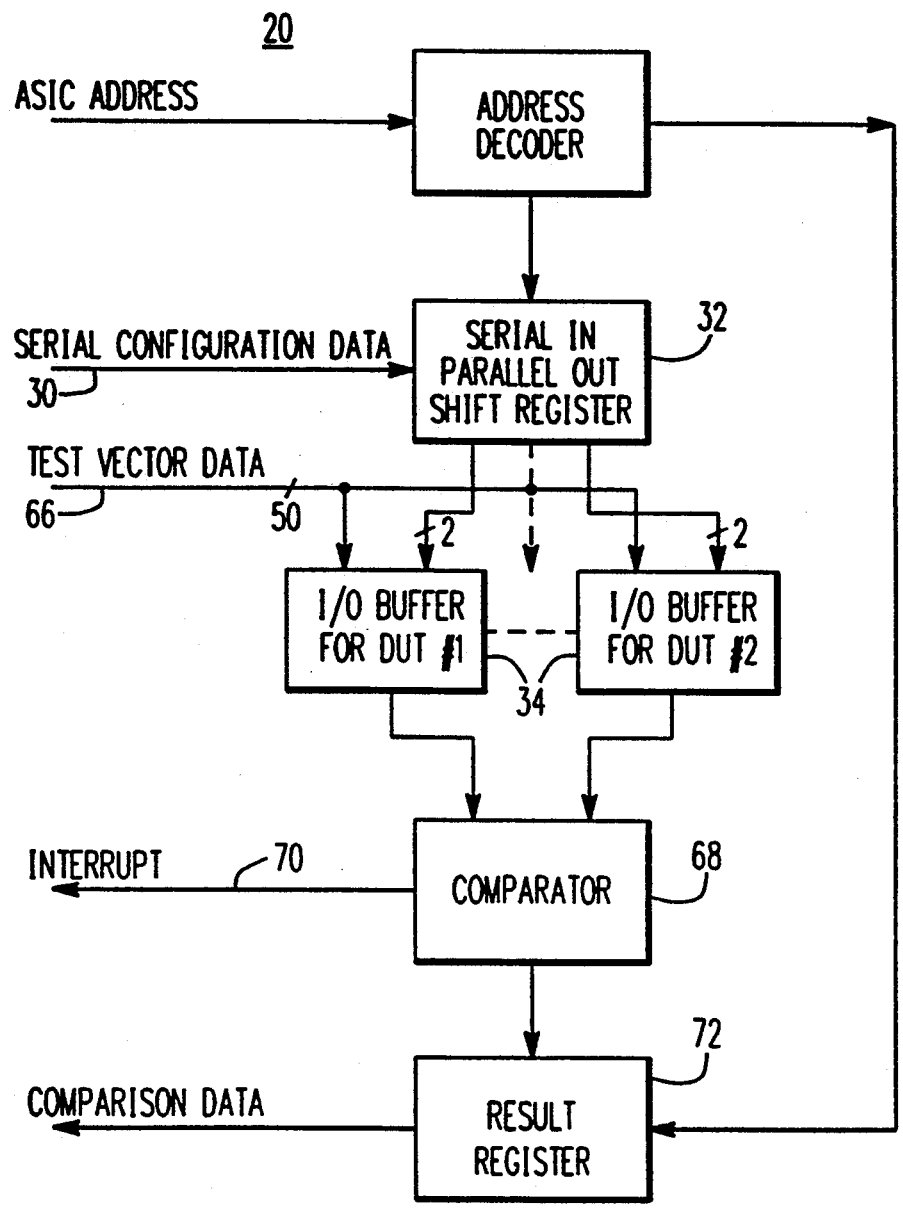
FIG. 2 is a block diagram of an ASIC used in the presently preferred embodiment of the tester of the present invention.
Figure 3:
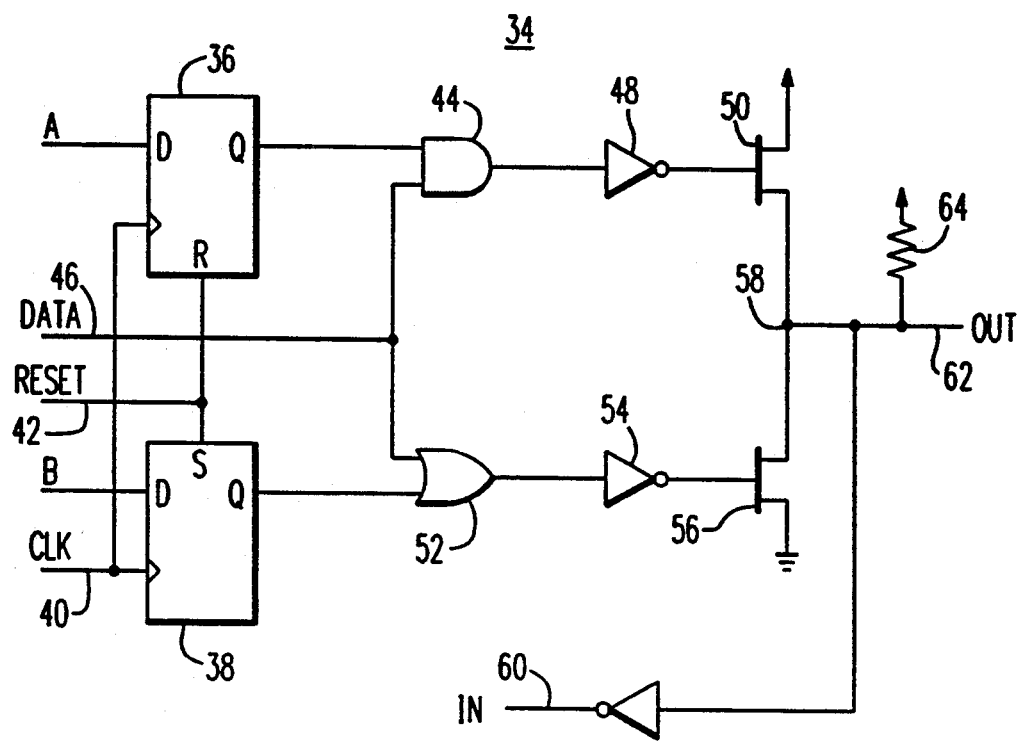
FIG. 3 is a schematic representation of the Input/Output buffers and control circuitry of the tester ASIC devices.

The configuration of tester ASIC 20 in test device 10 and any programmable DUT is performed by microprocessor 12 using data downloaded from host workstation 14 by means of the RS-232 interface. DUT 18 and tester ASIC 20 are configured by another serial port on microprocessor 12. As shown in FIGS. 1, 2, and 3, serial configuration data 30 is shifted into each tester ASIC 20 to load in internal serial in - parallel out shift register 32 with two bits dedicated to each input/output buffer 34 connected to DUT 18.

FIG. 3 shows the input/output buffer 34 of tester ASIC 20. As shown in FIG. 3, pad A is connected to latch 36 and pad B is connected to latch 38. Clock 40 and reset 42 are connected to both latch 36 and latch 38 to assist in the reconfiguration thereof. In operation, latch 36 maintains pad A in either a high or low state until activated by reset 42. Latch 38 operates in a similar manner with respect to pad B.

The resulting signal from latch 36 proceeds to AND gate 44 where it is processed with data 46. The resulting signal from the AND gate 44 is converted by inverter 48 with the resulting signal serving as the gate input to N-transistor 50.

In contrast to the output signal of latch 36, the output signal of latch 38 is introduced into OR-gate 52 with data 46 serving as the other OR-gate input. The output of OR-gate 52 is converted by inverter 54 with the resulting signal serving as the gate input to P-transistor 56. Transistors 50 and 56 are arranged such that the drains of transistors 50 and 56 are connected at junction 58.

By regulating pad A and pad B between a high and low state, transistors 50 and 56, respectively, can be turned on or off depending on the data 46 signal. Transistors 50 and 56 are operated to produce the desired direction of data flow inbetween IN port 60 and OUT port 62, thereby configuring input/output buffer 34. Pull-up resistor 64 is provided to create the tri-state portion of the configurable input/output buffer 34.

The two bits of configuration information from internal serial in - parallel out shift register 32 are used to program input/output buffers 34 in a variety of modes.

TABLE 1

| PAD A | PAD B | DATA | OUT |
|-------|-------|------|-----|
| 0 | 0 | 0 | 0 |
| 0 | 0 | 1 | 1R |
| 0 | 1 | 0 | TS |
| 0 | 1 | 1 | TS |
| 1 | 0 | 0 | 0 |
| 1 | 0 | 1 | 1 |
| 1 | 1 | 0 | 1R |
| 1 | 1 | 1 | 1 |

0 = LOW
1 = HIGH
TS = TRI-STATE
IR = RESISTIVE HIGH

Table 1 shows that when pad A is low and pad B is high, the output of buffer 34 become tri-state, regardless of the state of the data lines. This allows external data to pass to the IN port 60 of buffer 34.

For buffer 34 to be configured as an output, pad A must be high and pad B must be low. In these situations, data 46 passes to the OUT port 62 of buffer 34.

Buffer 34 may be configured as a bidirectional pad with pad A low and pad B low. This bidirectional configuration is configured as an open drain output in which no output enable pin is required. In this configuration, a high on data 46 produces a resistive high on OUT port 62 which can be overriden by an external driver. The tri-state pad is configured identical to the bidirectional pad in all other respects. In the tester application, when a tri-state or bidirectional pin is required, a high will be placed in the test RAM in those cycles in which the pin is to be tri-stated. This provides a resistive high which can be driven low by the DUTs 18.

After buffers 34 have been configured, test vector information is downloaded from host workstation 14 to test device 10. This information is loaded into test vector RAM 16. Each memory location in RAM 16 contains one cycle of test data 66. Counter 26 provides the address for the RAM during the free running test. The RAM outputs are passed to tester device 10 to be used as DUT 18 inputs or to compare with DUT 18 outputs, depending on the configuration loaded for each tester ASIC 20 pin.

All the tester ASICs 20 on test device 10 are identical. FIG. 2 shows the circuitry in each tester ASIC 20. In addition to the control signals required for configuration, tester ASICs 20 have a set of input data lines to accept test data from the test vector RAM 16 and two identical sets of output data lines to interface with the two DUT 18 sockets. The dash lines in FIG. 2 denote that a plurality of input/output buffers 34 may be used in the design. The number of buffers 34 is dependent on the particular tester ASIC 20 used in the tester design. In the design of FIG. 2, the number of buffers 34 is shown to be 50, with 25 used for each DUT 18 socket. Each of the output data lines are set up in pairs. Each element of the pair is connected to the same pin of the different DUT 18. These tester ASIC 20 pins also provide an input to tester ASIC 20, regardless of the configuration of the input/output buffer 34. These inputs are fed into a comparator 68 to test the outputs of the DUTs 18. If a difference is encountered, the values of the pins are captured for status information and an interrupt 70 is generated to the microprocessor 12 for testing to be handled. To capture more than one event in error, a first-in-first-out (FIFO) register 72 can be used. The error circuitry is daisy-chained so all tester ASICs 20 act as one unit.

In an alternative embodiment to the described architecture, the serial interface may be replaced by a bus interface particular to the host computer 14. One example of this is the IBM AT BUS. The design is placed on a board that is inserted directly into the host computer 14 add-on board slot, with an external board to hold the DUT 18 connected to the first board by a cable. If desired, the on-board microprocessor could be eliminated, with control for the entire test handled by the CPU of the host computer 18.

Test device 10 provides a modular design which can be expanded to any size DUT 18 by adding RAM and tester ASICs 20. The expandability of test device 10 increases the flexibility of its use and provides a low cost alternative to existing expensive machines. Test device 10 allows testing of bidirectional pins of the DUT 18 without the need of vector software to create and provide direction control for each pin of the DUT 18. Moreover, test device 10 provides an ASIC test capability to a low cost personal computer.

Test device 10 provides a designer the ability to program input/output pads after an ASIC is fabricated. Test device 10 also allows a designer to compare two devices or to test a single device to a specified response using the same circuitry. In fact, test device 10 permits a DUT 18 to be tested using the same computer 14 on which it was designed.

By allowing a comparison of the outputs of two DUTs with the same pin out, test device 10 provides a useful tool in a reverse engineering situation. For example, if a design was originally implemented in a field programmable gate array for low cost prototyping, and subsequently ported to an ASIC for lower cost production quantities, the two devices can be placed on test device 10 and the outputs can be automatically compared.

In the foregoing specification certain preferred practices and embodiments of this invention have been set out, however, it will be understood that the invention may be otherwise embodied within the scope of the following claims.

We claim:

1. An apparatus for testing a device under test comprising: 'a. processing means for controlling the testing of said device under test and initiating the transmission of a test signal to said device under test, said processing means interfacing an external controller;
   b. memory means for storing test vector data to be transmitted to said device under test;
   c. at least one test ASIC provided between said memory means and said device under test, said tester ASIC configured by said processing means with respect to said device under test to control the direction of data flow with said device under test, said at least one tester ASIC comprising a shift register adapted to receive configuration data from said processing means and at least one input/output buffer, said configuration data adapted to configure said at least one input/output buffer with respect to said device under test, said at least one input/output buffer comprising a first latch means adapted to receive a first configuration signal and a second latch means adapted to receive a second configuration signal, said first latch means acting with a data means by means of an AND-gate to operate a first transistor, said second latch means acting with said data means by means of an OR-gate to operate a second transistor, the drains of each of said first and second transistors being connected, said first and second transistors being operated to produce a desired direction of data flow between an IN port and an OUT port of said input/output buffer; and d) means for receiving said device under test into said apparatus.

2. The apparatus of claim 1 further comprising comparison means for comparing the results of said device under test in response to said test signal with data stored in a second memory means.

3. The apparatus of claim 1 wherein said device under test is an application specific integrated circuit.

4. The apparatus of claim 3 wherein said memory means comprises a RAM bank, said RAM bank equal in width to the number of input/output pins provided on said device under test.

5. The apparatus of claim 1 further comprising at least one additional tester ASIC, said at least one additional tester ASIC providing means to access at least one additional device under test.

6. The apparatus of claim 5 further comprising comparison means for comparing the results of said device under test in response to said test signal with the results of said at least one additional device under test in response to said test signal.

7. The apparatus of claim 1 further comprising clock means for synchronously testing said device under test, said clock means connected to said memory means to sequentially test said device under test.

8. A method for testing a device under test comprising the steps of:

a. providing a test apparatus having at least one configurable tester ASIC, said at least one tester ASIC comprising a shift register adapted to receive configuration data from a processing means and at least one input/output buffer, said configuration data adapted to configure said at least one input/output buffer with respect to said device under test, said at least one input/output buffer comprising a first latch means adapted to receive a first configuration signal and a second latch means adapted to receive a second configuration signal, said first latch means acting with a data means by means of an AND-gate to operate a first transistor, said second latch means acting with said data means by means of an OR-date to operate a second transistor, the drains of each of said first and second transistors being connected, said first and second transistors being operated to produce a desired direction of data flow between an IN port and an OUT port of said input/output buffer;

b. receiving said device under test into said test apparatus;

c. configuring said tester ASIC with respect to said device under test to control the direction of data flow with said device under test;

d. storing test vectors for said device under test; and e. transmitting said stored test vectors to said device under test by means of said tester ASIC.

9. The method of claim 8 further comprising the step of comparing the results of said device under test in response to said test vectors with known results stored in said tester.

10. The method of claim 8 further comprising the steps of providing at least one additional tester ASIC, configuring said at least one additional tester ASIC with respect to at least one additional device under test, and comparing the results of said device under test in response to said test vectors with results of said at least one additional device under test in response to said test vectors.

11. The method of claim 8 wherein said tester ASIC is configured by means of configuration data transmitted from said processing means to said at least one input/output buffer of said tester ASIC.

12. The method of claim 11 wherein said configuration data is received by said first and second latch means provided in said buffer, said first and second latch means directing said first and second transistor means, respectively, to produce a desired direction of data flow in said buffer.

* * * * *